(12) United States Patent
Meiser et al.

(10) Patent No.: US 9,853,637 B1
(45) Date of Patent: Dec. 26, 2017

(54) DUAL GATE SWITCH DEVICE

(71) Applicant: Infineon Technologies AG, Neubiberg (DE)

(72) Inventors: Andreas Meiser, Sauerlach (DE); Anton Mauder, Kolbermoor (DE); Jens Barrenscheen, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/192,473

(22) Filed: Jun. 24, 2016

(51) Int. Cl.
*H03K 17/687* (2006.01)
*H03K 7/08* (2006.01)

(52) U.S. Cl.
CPC .............. *H03K 17/687* (2013.01); *H03K 7/08* (2013.01); *H03K 2017/6878* (2013.01)

(58) Field of Classification Search
CPC ............... H03K 17/687; H03K 2017/6878
USPC ....... 326/82, 83, 89; 327/108, 109, 429, 479
See application file for complete search history.

(56) References Cited

U.S. PATENT DOCUMENTS

| | | | |
|---|---|---|---|
| 7,248,084 B2* | 7/2007 | Huang | H03K 3/00 326/82 |
| 2004/0135201 A1* | 7/2004 | Elbanhawy | H01L 29/402 257/335 |
| 2009/0058498 A1* | 3/2009 | Udrea | H01L 29/0638 327/423 |
| 2012/0169377 A1 | 7/2012 | Thiele et al. | |

OTHER PUBLICATIONS

U.S. Appl. No. 15/192,523, by Andreas Meiser, filed Jun. 24, 2016.
English Translation of Counterpart German Application 102015113494.2, by Infineon Technologies, filed on Aug. 14, 2015.
U.S. Appl. No. 15/056,392, filed Feb. 29, 2016.
U.S. Appl. No. 15/060,790, filed Mar. 4, 2016.
Office Action from U.S. Appl. No. 15/192,523, dated Apr. 19, 2017, 14 pp.
Response to Office Action dated Apr. 19, 2017, from U.S. Appl. No. 15/192,523, filed Jul. 19, 2017, 7 pp.
Notice of Allowance from U.S. Appl. No. 15/192,523, dated Sep. 15, 2017, 9 pp.

* cited by examiner

*Primary Examiner* — William Hernandez
(74) *Attorney, Agent, or Firm* — Shumaker & Sieffert, P.A.

(57) ABSTRACT

Switch devices using switch transistors with dual gates are provided. The dual gates may be controlled independently from each other by first and second gate driver circuits.

19 Claims, 5 Drawing Sheets

DUAL GATE SWITCH DEVICE

TECHNICAL FIELD

The present application relates to switch devices and corresponding methods.

BACKGROUND

Switches are used in electrical applications to selectively provide an electrical connection between two or more terminals of a switch. Power switches are used in applications where high voltages have to be switched and/or high currents have to be conducted via the switch, for example voltages of some hundred Volts and currents of several Amperes, for example several tens of Amperes. Such switches may inter alia be used in safety-critical environments, for example in automotive applications. In such environments, besides the "pure" function of a device like a switch (i.e. selectively providing an electrical connection), functional safety aspects become more and more important, for example in automotive applications in the power transmission chain, braking, engine management etc.

For example, according to some functional safety requirements, for a specific function there may have to be alternative ways to achieve this function, and/or a safe switch-off path to deactivate the function. For example, to achieve this, redundancy may be provided, for example alternative connections between devices, or different ways to achieve a function may be provided, which is an example for diversification (sometimes also referred to as diversity). To give an example, in conventional systems to control a switch or combination of switches (for example arranged in a half bridge topology), in some applications two signal paths are required: one to define a switching behaviour of the switch (for example by providing a pulse width modulated (PWM) signal), and another one to enable/disable the operation of the switch or combination of switches. These two signals are generated and provided by different paths. For example, a pulse width modulated signal may use a path through some logic blocks and a gate driver, whereas the enable signal interacts with the gate drive very closely for the switch.

Nevertheless, the two signals in conventional approaches are combined at some point, for example in a logic circuit or at a gate driver, to provide a single control signal to the switch. Therefore, at least in part of a circuit there is only a single connection to the switch (for example from the gate driver to the switch), for which no redundancy is provided.

SUMMARY

According to an implementation, a switch device is provided, comprising:
a switch transistor having a first gate and a second gate, wherein each gate controls part of a channel of the switch transistor,
a first gate driver circuit coupled to the first gate, and
a second gate driver circuit coupled to the second gate, the second gate driver circuit being independent from the first gate driver circuit.

According to another implementation, a method is provided, comprising:
providing a dual gate switch transistor,
coupling a first gate driver circuit to a first gate of the dual gate switch transistor, and
coupling a second gate driver circuit different from the first gate driver circuit to a second gate of the dual gate switch transistor.

According to yet another implementation, a method is provided, comprising:
controlling an electronic switch by a first control signal,
controlling the electronic switch by a second control signal independent from the first control signal, and
combining the first and second control signals within the electronic switch.

The above summary is only intended to provide a brief overview and is not to be construed as limiting in any way.

DETAILED DESCRIPTION

Figure 1:
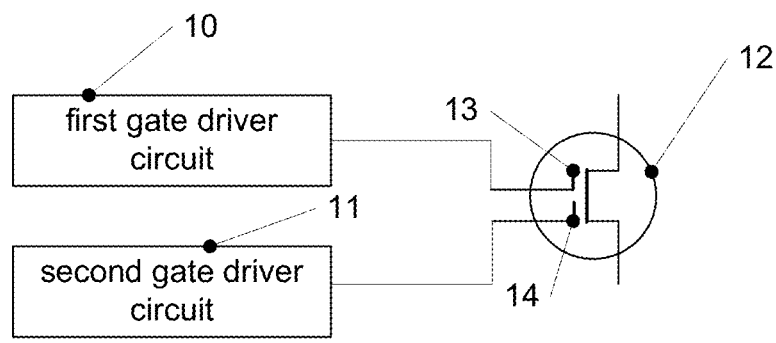
FIG. 1 is a block diagram of a switch device according to an embodiment.

In the following, various embodiments will be described referring to the attached drawings. These embodiments serve as examples only and are not to be construed as limiting. For example, while embodiments may be described comprising a plurality of features or elements, in other embodiments some of these features or elements may be omitted and/or may be replaced by alternative features or elements. Furthermore, in addition to the features or elements explicitly shown in the drawings and described herein further features or elements, for example features or elements employed in conventional switch devices, may be provided.

Features or elements from different embodiments may be combined with each other to form further embodiments. Variations or modifications described with respect to one of the embodiments may also be applicable to other embodiments.

In the embodiments described and shown, any direct electrical connection between components, i.e. any electrical connection without intervening elements (for example simple metal layers or wires) may also be replaced by an indirect connection or coupling, i.e. connection or coupling with one or more additional intervening elements, and vice versa, as long as the general purpose and function of the connection, for example to transmit a certain kind of signal or information or to provide a certain kind of control, is essentially maintained.

Some embodiments use dual gate transistors as switch devices. Dual gate transistors are transistors comprising a first load terminal, a second load terminal, a first gate terminal coupled to a first gate and a second gate terminal coupled to a second gate. Each gate controls part of a channel (e.g. n-channel or p-channel) of the dual gate transistor. In embodiments, only if a signal level activating the transistor is applied to both first and second gate terminals, the transistor becomes conducting between the first and second load terminals, i.e. provides a low-ohmic connection between the first and second load terminals, as then the complete channel becomes conducting. This state is also referred to as on-state or closed state of the transistor or switch. When at none of the first and second gate terminals or only at one of the first and second gate terminals a signal level activating the transistor is applied, the transistor is essentially non-conducting between its first and second load terminals. This state is also referred to as an off-state or open state of the transistor or switch. "essentially non-conducting" in this context means non-conducting apart from possible small leakage currents, which depending on the transistor implementation may occur. In case of implementation as field effect transistors, the first and second load terminals correspond to source and drain terminals. In case of other types of transistors like insulated gate bipolar transistors (IGBTs), the first and second gate terminals may correspond to collector and emitter terminals.

The signal level to activate the transistor (referred to as "active signal level" herein) depends on the type of transistor, for example on whether the transistor is implemented as an n-channel or a p-channel transistor.

As can be seen from the above explanations, the first and second gate terminals in some embodiments form an AND function for the signals applied thereto. By using such a dual gate transistor, independent signal paths (thus providing redundancy and/or diversity) for controlling the transistor may be provided up to the transistor itself, without having to merge paths at some position outside the transistor to provide a single control signal to the transistor. This in embodiments may increase redundancy and therefore may help to fulfill functional safety requirements.

Turning now to the Figures, FIG. 1 illustrates a switch device according to an embodiment. The switch device of FIG. 1 comprises a dual gate switch transistor 12 having a first gate 13 and a second gate 14. First gate 13 is driven by a first gate driver circuit 10, and second gate 14 is driven by a second gate driver circuit 11. First and second gate driver circuits 10, 11 operate independently from each other to drive first and second gates 13, 14, respectively. Switch 12 is only closed when both first and second gate driver circuits 10, 11 output a signal with an active signal level. This provides redundancy in driving switch transistor 12 and may help to fulfill functional safety requirements. First and second gate driver circuits 10, 11 to increase redundancy may be supplied by or comprise different power supplies. In other embodiments they may be supplied by a same power supply. As can be seen in FIG. 1, there is no common signal path for first and second gate drivers circuits 10, 11, such that also for the path from gate driver circuits 10, 11 to switch 12 redundancy is provided. The merging of the signal paths takes place in the switch itself by using the dual gate structure of the dual gate switch transistor, which essentially acts as an AND gate. This is in contrast to conventional solutions where a merging of signal paths has to take place outside the switch transistor, which leads to a path from the merging to the transistor being provided without redundancy.

Transistor 12 in some embodiments may be a power transistor usable to switch high voltages, for example voltages above 50 V or above 100 V, and/or high currents, for example above 1 A or above 10 A, but is not limited thereto. Transistor 12 may be implemented for example as a field effect transistor or IGBT and/or may comprise a plurality of transistor cells coupled in parallel. Example implementations for dual gate transistors will be discussed later referring to FIGS. 5-7.

In embodiments, a timing of signals output by first gate driver circuit 10 is independent of a timing of signals output by second gate driver circuit 11. For example, one of first and second gate driver circuits 10, 11 may output an enable signal, which on average has a lower toggling frequency (frequency of switching between an active signal level and inactive signal level) than a signal output by the other one of first and second gate driver circuit is 10, 11, which is used to control the actual switching of transistor 12.

Figure 2:
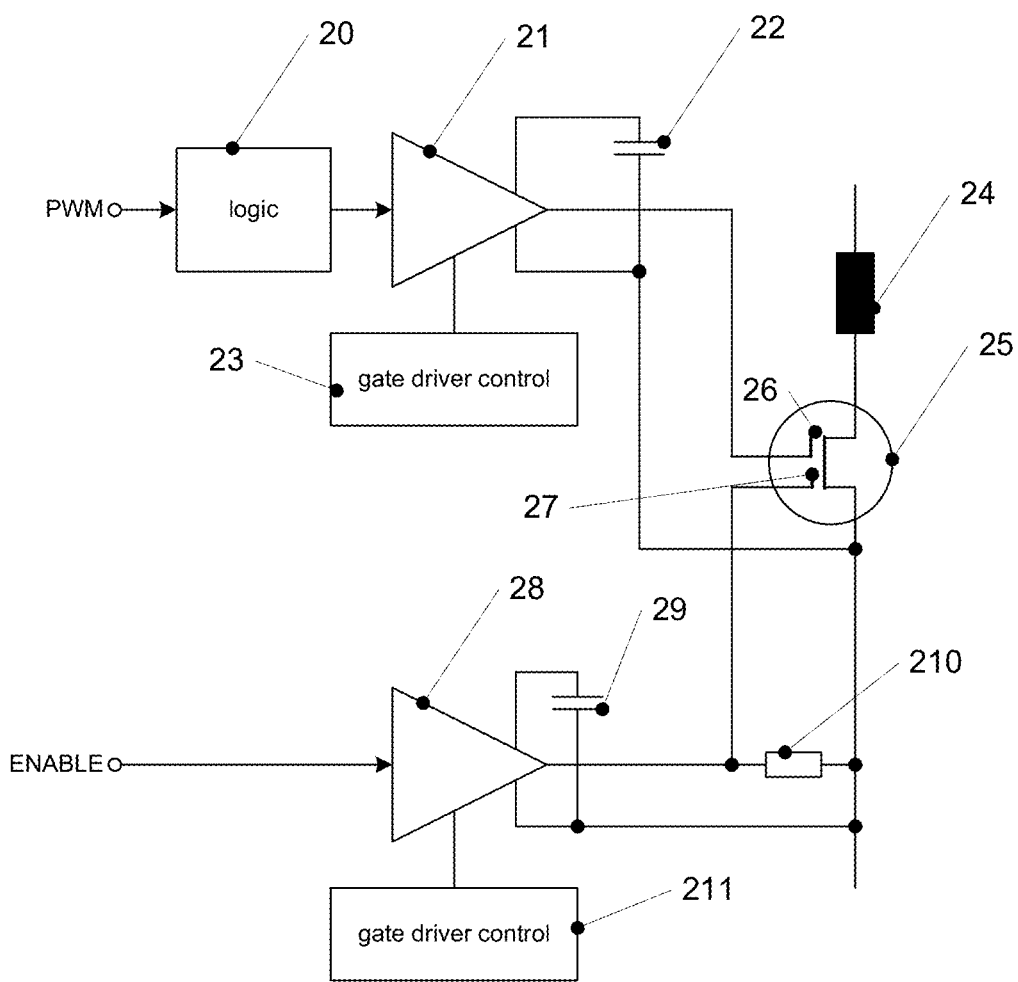
FIG. 2 is a circuit diagram of a switch device according to an embodiment.

To illustrate further, FIG. 2 illustrates a circuit diagram of a switch device according to an embodiment. The switch device of FIG. 2 comprises a dual gate transistor 25 having a first gate terminal 26 and a second gate terminal 27. Transistor 25 may be used to selectively couple a load 24 with a supply voltage or reference potential, for example a positive supply voltage or ground. In the example of FIG. 2, transistor 25 may act as a so-called low side switch to selectively couple load 24 with a reference potential like ground or a negative supply voltage. A high side switch to couple load 24 selectively to a positive supply voltage may be implemented correspondingly.

First gate terminal 26 is driven by a first gate driver 21. First gate driver 21 is supplied by a first power supply 22. A first gate driver controller 23 may be used to selectively enable and disable first gate driver 21. First gate driver 21 receives an input signal from a logic circuit 20. Logic circuit 20 may receive or generate a pulse width modulated (PWM) signal for switching transistor 25 on and off.

Second gate terminal 27 is driven by a second gate driver 28. Second gate driver 28 is supplied by a second power supply 29, which is independent from first power supply 22. Second gate driver 28 may be selectively enabled and disabled using a second gate driver controller 211, which is independent from first gate driver controller 23. Second gate driver 28 in the example of FIG. 2 receives an ENABLE signal to selectively enable and disable switching of transistor 25.

Therefore, in the embodiment of FIG. 2 signals driving first and second gate terminals 26, 27 of transistor 25 are generated independently from each other.

Optionally, and shown only for second gate terminal 27 in FIG. 2, a discharge element 210, for example a discharge resistor or other impedance, may be provided. Such a discharge element in embodiments may ensure that the respective gate terminal is discharged in case the gate driver output (in this case output of second gate driver 28) is disconnected from the respective gate terminal (here: 27). A similar discharge element alternatively or additionally may be provided for first gate terminal 26. In other embodiments, providing a discharge element may be omitted. The discharge element may be implemented in the switch itself, e.g. in a polysilicon structure. Such a discharge element may define a safe state for the transistor.

In some embodiments, all elements of FIG. 2 apart from load 24 may be implemented in a single integrated circuit on a single chip die. In other embodiments, for example discharge element 210 may be an external element. In yet other embodiments, discharge element 210 may be integrated in a package of the switch device for example by chip-on-chip or chip-by-chip embedding or can be directly integrated in the switch device itself, for example formed as a polysilicon layer. In other embodiments, the circuitry controlling first gate terminal 26 (i.e. components 20-23) may be implemented on a separate chip die from the components controlling second gate terminal 27 (i.e. components 28, 29, 211).

Figure 3:
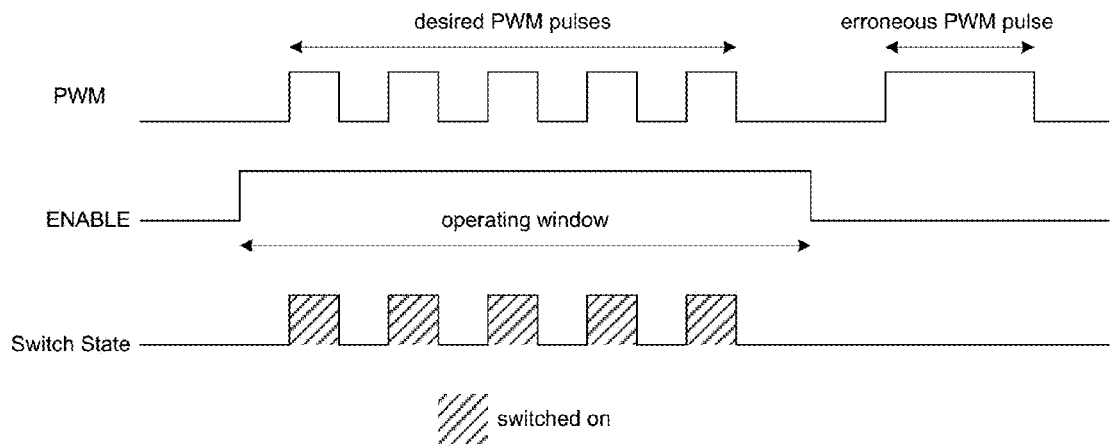
FIG. 3 illustrates example signals for the switch device of FIG. 2.

To illustrate the operation of the embodiment of FIG. 2, FIG. 3 illustrates example signal waveforms. It should be noted that the signal waveforms of FIG. 3 serve only for illustration purposes to provide a deeper understanding and are not to be construed as limiting, as the signals used may depend on a particular implementation of the switched device and on a particular application.

FIG. 3 illustrates a pulse width modulated signal PWM (as input for example to logic circuit 20 to control first gate driver 21) and an ENABLE signal fed to second gate driver circuit 28.

The ENABLE signal as illustrated in FIG. 3 defines an operating window within which transistor 25 may be switched using the signal PWM. The signal PWM defines the actual switching.

For the PWM signal, a number of desired PWM pulses are shown within operating window defined by the ENABLE signal. These change the switch state of transistor 25 as shown in the bottom line of FIG. 3. In contrast thereto, an erroneous PWM pulse occurring outside the operating window does not lead to a change of state of the switch. Therefore, the ENABLE signal provides an additional safety measure to prevent undesired switching due to erroneous PWM pulses outside the operating window.

It should be noted that while in the embodiments above dual gate transistors are used providing two independent paths, also more than two gates, for example three gates, with a corresponding number of independent control paths may be used.

Figure 4:
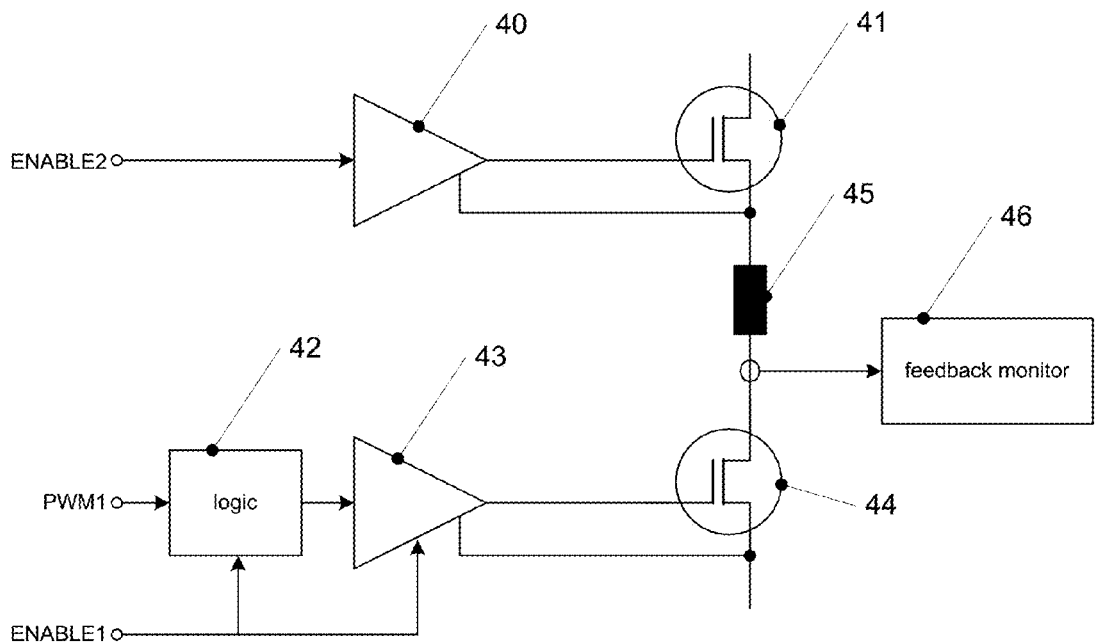
FIG. 4 illustrates a switch device arrangement.

For comparison purposes, FIG. 4 shows a conventional switch control of a switch transistor 44 operated as low side switch together with further elements. In FIG. 4, low side switch transistor 44 is a single gate transistor and serves to selectively couple a load 45 to a negative supply voltage or reference potential like ground. Low side switch transistor 44 is controlled by a gate driver 43. Gate driver 43 is controlled by an output signal of a logic circuit 42, which in turn may be controlled by a pulse width modulated signal PWM1.

Furthermore, logic circuit 42, gate driver 43 or both may be enabled and disabled by an enable signal ENABLE1. Signals PWM1, ENABLE1 essentially serve the same function as the signals PWM, ENABLE discussed with reference to FIGS. 2 and 3. However, in FIG. 4, as the enable signal ENABLE1 acts on logic circuit 42 and/or gate driver 43, only a single connection runs from gate driver 43 to switch transistor 44, such that for controlling switch transistor 44 itself no redundance is provided between gate driver 43 and switch transistor 44. In contrast thereto, by using a dual gate switch transistor as explained with reference to FIGS. 1-3 redundancy may be provided.

Therefore, in embodiments instead of components 42, 43 and 44 illustrated in FIG. 4 a dual gate transistor with corresponding control circuitry as explained with reference to FIG. 1 or 2 may be provided to selectively couple load 45 to a negative supply voltage or a reference potential like ground. In addition to components 42, 43 and 44 implementing a low side switch, the device of FIG. 4 comprises further components 40, 41 and 46. These components will be described next and may also be used in embodiments using a dual gate switch. For example, in embodiments as explained above components 42, 43 and 44 may be replaced by the switch device of FIG. 1 or 2, while the remaining components of FIG. 4 remain. In other embodiments, some or all of the remaining components of FIG. 4 may be omitted. It should be noted that in other embodiments the order of transistor 44 and load 45 or transistor 41 and load 45 may also be reversed. In some embodiments, this may make a circuit layout easier.

In particular, the device of FIG. 4 comprises a transistor 41 acting as high side switch driven by a gate driver 40. Gate driver 40 is controlled by a further enable signal ENABLE2. Using both transistors 41 and 44 may help in dealing with short circuits over load 45. In the device of FIG. 4, only when both enable signals ENABLE1 and ENABLE2 indicate an enabling of the respective switch, current may flow via load 45.

Furthermore, and independently therefrom, the device of FIG. 4 comprises a feedback monitor 46 which may for example measure a current flow via load 45 and may open transistor 41 and/or transistor 44 (for example via enable signals ENABLE2, ENABLE1, respectively) for example in case an overcurrent, overvoltage or other undesired potential error state is detected.

Next, for further illustration with reference to FIGS. 5-7 example implementations of dual gate transistors which are usable as dual gate transistors 12, 25 of FIGS. 1 and 2, respectively will be discussed. These dual gate transistors are merely implementation examples, and other dual gate transistors may also be used.

Figures 5A, 5B:
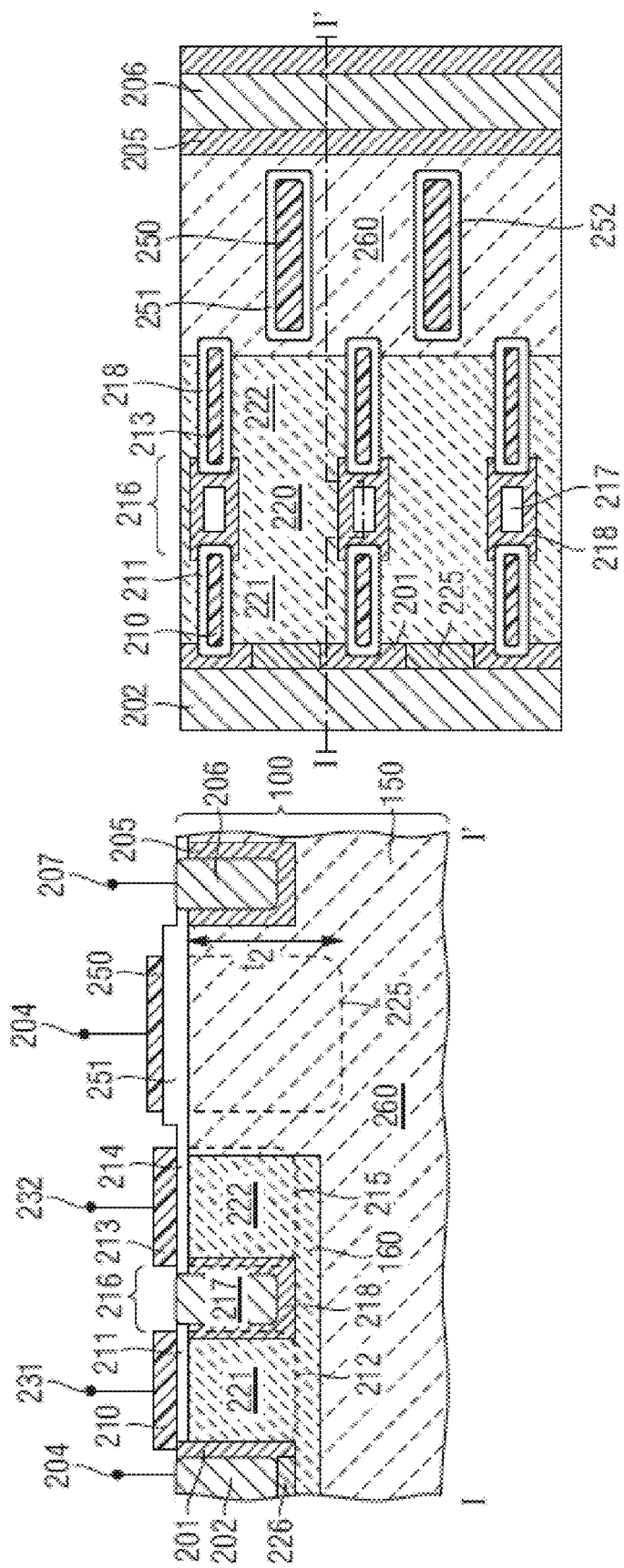
FIGS. 5A and 5B illustrate an implementation example of a dual gate transistor usable in embodiments.

FIG. 5A illustrates a cross-sectional view of a dual gate transistor according to an embodiment, and FIG. 5B illustrates a horizontal cut through the structure of FIG. 5B close to the silicon surface, as indicated by reference points I and I' visible in both Figures. In the dual gate transistor of FIGS. 5A and 5B, a source down configuration may be used where a deep metal contact on the source side feeds in current from a backside of the semiconductor body to two serial ordered gate trenches in a common bulk region. Both channel regions are connected to each other with an additional deep n+/metal contal plug. A high voltage drift zone is realized with separate field plate trenches compensating drift zone doping. A shallower drain contact metal plug is collecting the current and conducts it towards a front side of the semiconductor body.

FIGS. 5A and 5B show a dual gate transistor. The terms "lateral" and "horizontal" as used for describing dual gate transistor structures intend to describe an orientation parallel to a first surface of a semiconductor substrate or semiconductor body. This can be for instance the surface of a wafer or a die.

The term "vertical" intends to describe an orientation which is arranged perpendicular to the first surface of the semiconductor substrate or semiconductor body.

The terms "wafer", "substrate", "semiconductor substrate" or "semiconductor body" used in the following may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, silicon carbide (SiC) or gallium nitride (GaN) may form the semiconductor substrate material.

The transistor of FIGS. 5A and 5B comprises a source region 201 and a drain region 205. The transistor further comprises a first gate electrode 210 and a second gate electrode 213. The first gate electrode 210 is disconnected from the second gate electrode 213, i.e. the first gate electrode and the second gate electrode are separated from each other and are not connected to a common terminal. The transistor 200 further comprises a body region 220. The first gate electrode 210 is disposed adjacent to a first portion 221 of the body region 220 and the second gate electrode 213 is adjacent to a second portion 222 of the body region 220.

The transistor further comprises first trenches 212, the first trenches patterning the first portion 221 of the body region 220 into a first ridge. The transistor further comprises second trenches 215, the second trenches 215 patterning the second portion 222 of the body region 220 into a second ridge. The first gate electrode 210 is arranged in at least one of the first trenches 212 and the second gate electrode 213 is arranged in at least one of the second trenches 215. The first and the second trenches 212, 215 are indicated by broken lines in FIG. 5A. In more detail, they are disposed before and behind the depicted plane of the drawing. The first trenches 212 and the second trenches 215 pattern the first portion 221 of the body region into first ridges and pattern the second portions 222 of the body region 220 into second ridges.

Elements of field effect transistors are described herein. Generally, a field effect transistor comprises a plurality of transistor cells that are connected in parallel. For example, as will be discussed in the present specification, each single transistor cell comprises a first gate electrode, a second gate electrode, a body region and further components. The first gate electrodes of the single transistor cells may be connected to a common terminal, e.g. a first gate terminal. The second gate electrodes of the single transistor cells may be connected to a common terminal, e.g. a second gate terminal. Further components of the single transistor cells, e.g. source regions, drain regions may be respectively connected to a common source terminal, a common drain terminal etc. The following description specifically describes the structure of the single transistor cells while generally referring to a transistor. However, as is to be clearly understood the single transistor cells are connected with a plurality of further transistor cells so as to form the respective transistor. Some of the components of the transistor cells such as the body regions may be formed separately from each other. Other components of the transistor cells such as the drain regions may be formed jointly for all of the transistor cells connected in parallel.

The source region 201 and the drain region 205 may be of the first conductivity type, e.g. n-type, and the body region 220 may be of the second conductivity type, e.g. p-type.

The source region 201 is disposed adjacent to a first main surface of a semiconductor substrate 100. For example, the source region 201 may extend into the semiconductor substrate 100, for example to a bottom side of the first trench 212. The source region 201 may be electrically connected to a source terminal 204 via a source contact 202. According to an embodiment, the source contact 202 may be electrically connected to the first portion 221 of the body region 220 and to the body region 220 by means of a horizontal body contact portion 226. The horizontal body contact portion 226 may be disposed at a bottom side of the source contact 202.

The source region 201 and the drain region 205 are disposed along a first direction, e.g. the x-direction parallel to a horizontal surface of the semiconductor substrate 100. The first and second trenches 212, 215 may have a longitudinal axis that extends in the first direction.

The semiconductor device may further comprise a connection portion 216 that electrically connects the first portion 221 of the body region with the second portion 222 of the body region. For example, as is illustrated in FIG. 1A, the connection portion may be implemented by a connection groove having sidewalls which are doped with dopants of the first conductivity type to form a doped region 218 and may be filled with a conductive filling 217.

The first gate electrode 210 may be insulated from the first portion 221 of the body region by means of a first gate dielectric layer 211. Further, the second gate electrode 213 may be electrically insulated from the second portion 222 of the body region by means of a second gate dielectric layer 214. The first gate electrode 210 may be connected to a first gate terminal 231, and the second gate electrode 213 may be electrically connected to a second gate terminal 232. According to an interpretation, the second gate electrode 213 and the adjacent second portion 222 of the body region may be understood to implement a drift region which is controlled by a second gate electrode 213.

The transistor of FIGS. 5A and 5B further comprises a drift zone 260 disposed between the second portion 222 of the body region 220 and the drain region 205. For example, the drift zone 260 may be of the first conductivity type, e.g. at a lower doping concentration than the source region 201 or the drain region 205. Due to the presence of the drift zone 260 even at high voltages between source region and drain region a breakdown may be prevented.

FIG. 5A shows a horizontal cross-sectional view. As is shown, the drift zone 260 is disposed as a region extending along the second direction, e.g. the y direction. The drift zone 260 is disposed between the body region 220 and the drain region 205.

According to the embodiment illustrated in FIGS. 5A and 5B, the semiconductor substrate 100 may comprise a base layer which may be of the second conductivity type, e.g. p-type. A second semiconductor layer 150 of the first conductivity type, e.g. n-type may be formed over the base layer. A buried layer of the first conductivity type which is doped at a higher doping concentration than the second semiconductor layer 150 may be disposed between the base layer and the second semiconductor layer 150. A doped layer 160 which may e.g. be of the second conductivity type is formed over the second semiconductor layer 150. The buried layer provides an electrical insulation of the components of the transistor 200 from the base layer. The body region 220 may be defined by the doped layer 160.

According to any embodiments, the doping concentration in the various semiconductor layers may have a gradient. For example, the doping concentration may vary at different portions depending on the requirements of the semiconductor device.

The transistor according to the embodiment shown in FIGS. 5A and 5B furthermore comprises a field plate 250 which may be disposed adjacent to the drift zone 260. The field plate 250 may be insulated from the drift zone 260 by means of a field dielectric layer 251. The field plate 250 may be connected to a suitable terminal. For example, as is illustrated in FIG. 5A, the field plate 250 may be electrically connected to the source terminal 204. When the transistor is switched off, the field plate may deplete charge carriers from the drift zone so that the breakdown voltage characteristics of the semiconductor device are improved. In a semiconductor device comprising a field plate, the doping concentration of the drift zone may be increased without deteriorating the breakdown voltage characteristics in comparison to a device without a field plate. For example, the doping concentration may be increased in a portion adjacent to the field plate. Further, a region below this portion may be doped at a lower doping concentration in order to provide the desired breakdown voltage characteristics. Due to the higher doping concentration of the drift zone, the on-resistance Ron.A is further decreased resulting in improved device characteristics.

The field plate 250 may be implemented as a planar field plate which is disposed entirely over the semiconductor substrate 100. According to a further embodiment, the field plate 250 may be disposed in field plate trenches 252 that pattern the drift zone 260 into a third ridge. For example, as is shown in FIG. 5A, the field plate trenches 252 may be disposed before and behind the depicted plane of the drawing. For example, the field plate trenches 252 may extend to a deeper depth than the first and second gate trenches 212, 215. Further, as is shown in FIG. 5A, the depth t2 may larger than the depth t1 of the gate trenches. For example, etching the gate trenches 212, 215 may be performed simultaneously with etching the field plate trenches 252. Due to the larger width of the field plate trenches 252 the field plate trenches may be etched to a larger depth. For example, a bottom side of the field plate trench 252 may be below the bottom side of the body region 220.

FIG. 5B as mentioned shows a horizontal cross-sectional view of the transistor. As is shown, field plate trenches 252 are disposed in the drift zone 260. For example, field plate trenches 252 may have larger width measured along the second direction than the gate trenches 212, 215. Further, a distance between adjacent field plate trenches 252 may be larger than a distance between adjacent first gate trenches 212 or adjacent second gate trenches 215.

Figure 6:
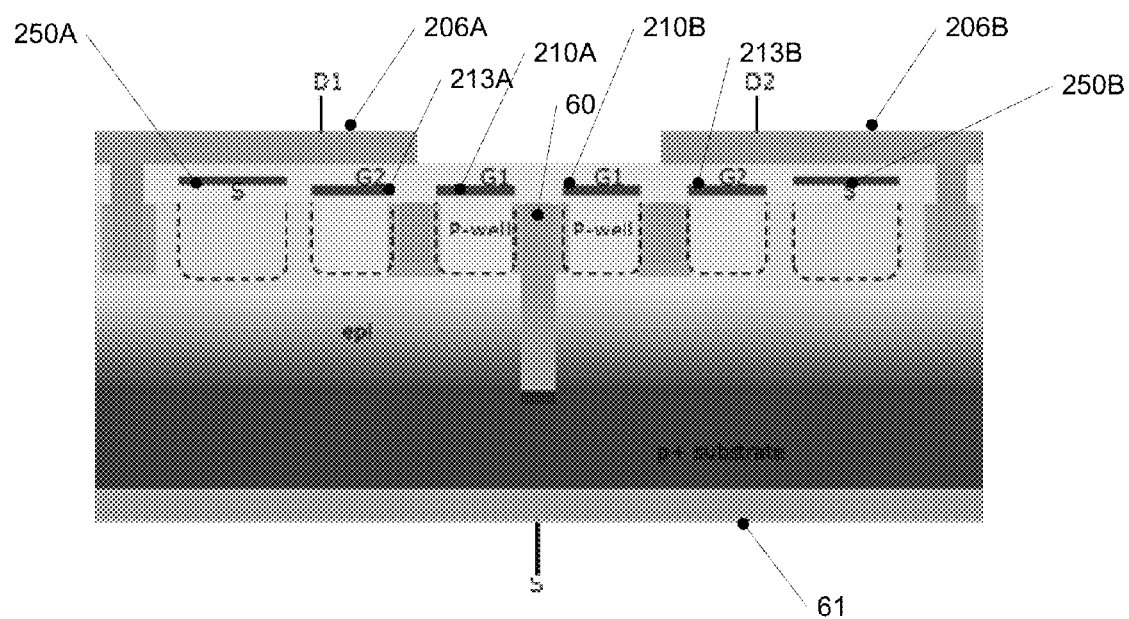
FIG. 6 illustrates a cross-sectional view of a dual gate transistor structure usable in some embodiments.

FIG. 6 essentially illustrates a cross-sectional view with two dual gate transistors having separate drain regions (206A, 206B), but a common source terminal 61. The structure of FIG. 6 is essentially a symmetrically mirrored version of the structure of FIG. 5A, and corresponding elements are labelled with the same reference numerals (with additions of A and B to distinguish elements of the two transistors) separated by a trench material 60. Therefore, the elements will not be described again in detail. By providing two transistors with separate drains but common source, for example a current sensing may be performed, usable for example for feedback monitoring as by component 46 of FIG. 4

Figure 7:
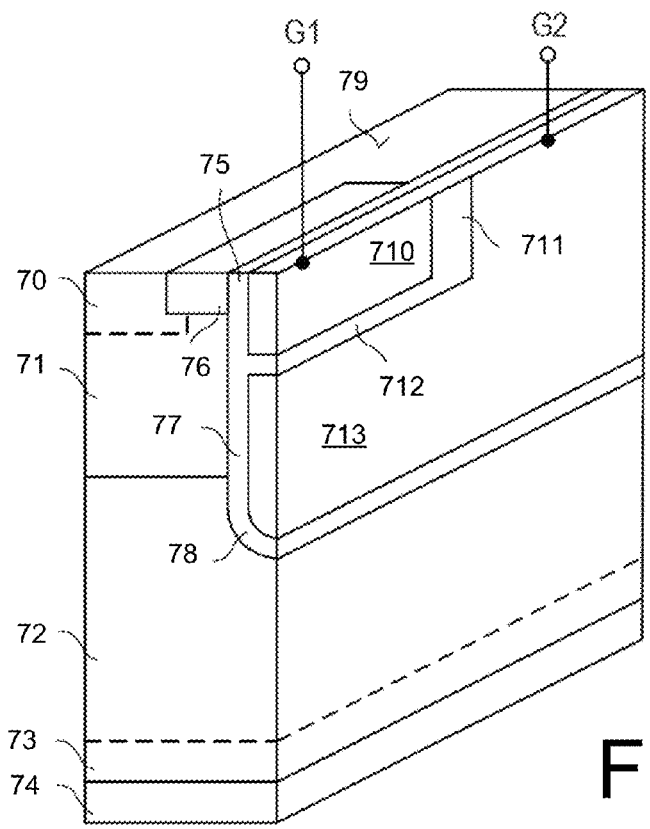
FIG. 7 illustrates a dual gate transistor structure usable in some embodiments.

FIG. 7 illustrates a dual gate device according to a further embodiment in form of a vertical dual gate device. FIG. 7 shows a perspective sectional view of one transistor cell having a first gate terminal G1 and a second gate terminal G2. A transistor usable in embodiments may comprise a plurality of cells as shown in FIG. 7 connected in parallel. In FIG. 7, numeral 74 denotes a drain region or a collector region in case the dual gate device is an IGBT, 76 denotes a source region or an emitter region in case of an IGBT, 72 denotes a drift region, 73 denotes an optional field-stop region of a same doping type as drift region 73, a doping concentration in region 73 being higher than in drift region 73 and lower than in drain region 74 or lower than in the source region 76, 71 denotes a body region and 70 denotes a contact region to the source. In the embodiment shown in FIG. 7, a section of a second gate electrode 713 extends to a first surface 79 of a semiconductor body. By this, the second gate electrode 713, like a first gate electrode 710, can be contacted at the first surface 101 of the semiconductor body. In a region where the second gate electrodes 713 extends to the surface 79, the second gate electrode 713 is insulated from the first gate electrode 710 by a separation layer 711. This separation layer 711 may include the same type of material as a first gate dielectric 75, a second gate dielectric 78 and a separation layer 712. A thickness, which defines the shortest distance between the first gate electrode 710 and the second gate electrode 713, is greater than a first thickness of the first gate dielectric 75 and a second thickness of the second gate dielectric 78, for example.

With the dual gate transistor in FIG. 7, for example gate G1 may be controlled by an enable signal (for example signal ENABLE of FIG. 2), and gate G2 may be controlled by a pulse width modulation signal (for example PWM of FIG. 2). The structure of FIG. 7 in embodiments may be adapted to prevent an unintended turnon of the transistor during a high voltage gradiant (high DV/DT) at drain or collector terminals.

The illustrated dual gate transistors, as already mentioned, serve only as example for possible implementation of dual gate transistors.

Figure 8:
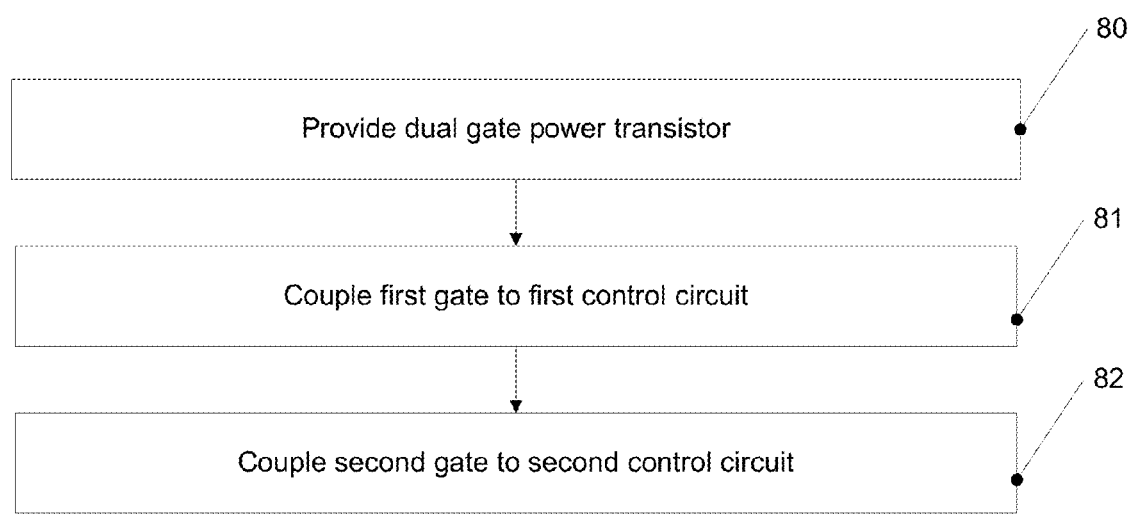
FIG. 8 is a flow chart illustrating a method according to an embodiment.

FIG. 8 illustrates a flow chart illustrating a method according to an embodiment. While the method of FIG. 8 is depicted and will be described as a series of acts or events, the order in which these acts or events are described is not to be construed as limiting. For ease of reference, the method of FIG. 8 will be described referring to the embodiments of FIGS. 1 and 2. However, this is merely for illustration purposes, and the method of FIG. 8 may also be used independently from the embodiment of FIGS. 1 and 2.

At 80 in FIG. 8, a dual gate transistor, in particular a dual gate power transistor is provided. For example, dual gate transistor 12 of FIG. 1 or dual gate transistor 25 of FIG. 2 may be provided. The dual gate transistor may be implemented as described with reference to FIGS. 5-7, but is not limited thereto.

At 81 in FIG. 8, the method comprises coupling a first gate of the dual gate transistor to a first control circuit. Examples for the first control circuit are first gate driver circuit 10 of FIG. 1 or components 20-23 of FIG. 2.

At 82, the method comprises coupling a second gate of the dual gate transistor to a second control circuit. Examples for the second control signal include second gate driver circuit 11 of FIG. 11 or components 28, 29 and 211 of FIG. 2.

The coupling at 81 may involve supplying a first control signal to the first gate terminal by the first gate control circuit. The coupling at a 82 may involve providing a second control terminal to the second gate terminal of the dual gate transistor by the second gate control circuit. The first and second control signals may be, as discussed previously, for example with respect to FIG. 3.

Optionally, additional components may be provided, for example a discharge element like discharge element 210 of FIG. 2, an additional switch transistor like transistor 41 of FIG. 4 or a feedback circuit like feedback monitor 46 of FIG. 4.

According to some embodiments, the following examples are provided:

Example 1

A switch device, comprising:

a switch transistor having a first gate and a second gate, wherein each gate controls part of a channel of the switch transistor, a first gate driver circuit coupled to the first gate, and a second gate driver circuit coupled to the second gate, the second gate driver circuit being independent from the first gate driver circuit.

Example 2

The switch device of example 1, wherein the switch transistor is configured such that it is an on-state only when an active signal level is present both at the first gate and at the second gate.

Example 3

The switch device of example 1 or 2, wherein the first gate driver circuit comprises a first gate driver, and wherein the second gate driver circuit comprises a second gate driver different from the first gate driver.

Example 4

The switch device of any one of examples 1-3, wherein the first gate driver circuit comprises a first power supply, and wherein the second gate driver circuit comprises a second power supply different from the first power supply.

Example 5

The switch device of any one of examples 1-4, wherein the first gate driver circuit and the second gate driver circuit are provided on different chips.

Example 6

The switch device of any one of examples 1-5, wherein the first gate driver circuit and the second gate driver circuit are provided as independent control paths.

Example 7

The device of any one of examples 1-6, further comprising a gate discharge component associated with at least one of the first gate and the second gate.

Example 8

The device of example 7, wherein the gate discharge component is coupled between an associated one of the first and second gates and a load terminal of the switch transistor.

Example 9

The switch device of any one of examples 1-8, wherein the second gate driver circuit is configured to output a signal defining an operation window of the switch transistor, and wherein the first gate driver circuit is configured to output a signal controlling switching of the switch transistor.

Example 10

The switch device of example 9, wherein the first gate driver circuit is configured to output a pulse with modulated signal.

Example 11

The switch device of any one of examples 1-10, wherein the first gate driver circuit is configured to output a signal having a higher average toggling frequency than a signal output by the second gate driver circuit.

Example 12

The switch device of any one of examples 1-11, wherein the switch device is to be coupled between a first terminal of a load and a negative supply voltage or ground, the second terminal of the load to be coupled with a positive supply voltage.

Example 13

The switch device of example 12, further comprising a further switch transistor to be coupled between the load and the positive supply voltage.

Example 14

A method comprising:
providing a dual gate switch transistor,
coupling a first gate driver circuit to a first gate of the dual gate switch transistor, and
coupling a second gate driver circuit different from the first gate driver circuit to a second gate of the dual gate switch transistor.

Example 15

The method of example 14, further comprising coupling a discharge element between one of the first and second gates of the dual gate switch transistor and a load terminal of the dual gate switch transistor.

Example 16

The method of example 14 or 15, further comprising supplying a pulse width modulated signal to the first gate driver circuit, and supplying an enable signal to the second gate driver circuit.

Example 17

The method of any one of examples 14-16, further comprising providing the first gate driver circuit including a logic circuit.

Example 18

A method, comprising:
controlling an electronic switch by a first control signal,
controlling the electronic switch by a second control signal independent from the first control signal, and
combining the first and second control signals within the electronic switch.

Example 19

The method of claim 18,
wherein the electronic switch is a dual gate switch transistor,
wherein controlling the electronic switch by the first control signal comprises controlling a first gate of the dual gate switch transistor with a pulse width modulated signal to control a first part of a channel of the dual gate switch transistor, and
wherein controlling the electronic switch by the second control signal comprises controlling a second gate of the dual gate switch transistor with an enable signal defining an operation window of the dual gate switch transistor to control a second part of the channel of the dual gate switch transistor, such that the combining is performed by the dual gate switch transistor.

Example 20

The method of example 19, wherein controlling the first gate comprises providing a pulse width modulated signal to a first gate driver circuit, and wherein controlling the second gate comprises providing an enable signal to a second gate driver circuit, the second gate driver circuit being independent from the first gate driver circuit.

Example 21

The method of example 20, further comprising providing the first gate driver circuit with power independent from providing the second gate driver circuit with power.

Example 22

The method of any one of examples 18-21, further comprising selectively coupling a load to a supply voltage by controlling the electronic switch.

Example 23

The method of example 22, wherein said selectively coupling providing comprises selectively coupling the load to one of ground or negative supply voltage, the method further comprising selectively coupling the load to a positive supply voltage using a further switch transistor.

Example 24

The method of any one of examples 18-23, further comprising independently controlling a first gate driver coupled to the first gate and a second gate driver coupled to the second gate.

As can be seen from the variations and modifications described above, the discussed embodiments serve as examples only and are not to be construed as limiting.

What is claimed is:

1. A switch device, comprising:
    a switch transistor having a first gate and a second gate, wherein each gate controls part of a channel of the switch transistor,
    a first gate driver circuit coupled to the first gate, and
    a second gate driver circuit coupled to the second gate, the second gate driver circuit being independent from the first gate driver circuit, wherein the switch transistor is configured such that the switch transistor is in an on-state only when an active signal level is present at the first gate and when the active signal level is present at the second gate.

2. The switch device of claim 1, wherein the first gate driver circuit comprises a first gate driver, and wherein the second gate driver circuit comprises a second gate driver different from the first gate driver.

3. The switch device of claim 1, wherein the first gate driver circuit comprises a first power supply, and wherein the second gate driver circuit comprises a second power supply different from the first power supply.

4. The switch device of claim 1, wherein the first gate driver circuit and the second gate driver circuit are provided on different chips.

5. The device of claim 1, further comprising a gate discharge component associated with at least one of the first gate and the second gate.

6. The device of claim 5, wherein the gate discharge component is coupled between an associated one of the first and second gates and a load terminal of the switch transistor.

7. The switch device of claim 1, wherein the second gate driver circuit is configured to output a signal defining an operation window of the switch transistor, and wherein the first gate driver circuit is configured to output a signal controlling switching of the switch transistor.

8. The switch device of claim 7, wherein the first gate driver circuit is configured to output a pulse width modulated signal.

9. The switch device of claim 1, wherein the first gate driver circuit is configured to output a signal having a higher average toggling frequency than a signal output by the second gate driver circuit.

10. The switch device of claim 1, wherein the switch device is to be coupled between a first terminal of a load and a negative supply voltage or ground, the second terminal of the load to be coupled with a positive supply voltage.

11. The switch device of claim 10, further comprising a further switch transistor to be coupled between the load and the positive supply voltage.

12. A method comprising:
    providing a dual gate switch transistor that includes a first gate and a second gate, wherein the dual gate switch transistor is configured to be in an on-state only when an active signal level is present at the first gate and when the active signal level is present at the second gate,
    coupling a first gate driver circuit to the first gate of the dual gate switch transistor, and
    coupling a second gate driver circuit different from the first gate driver circuit to the second gate of the dual gate switch transistor.

13. The method of claim 12, further comprising coupling a discharge element between one of the first and second gate terminals of the dual gate switch transistor and a load terminal of the dual gate switch transistor.

14. A method, comprising:
    controlling an electronic switch by a first control signal, wherein the electronic switch includes a first gate and a second gate and is configured to be in an on-state only when an active signal level is present at the first gate and when the active signal level is present at the second gate,
    controlling the electronic switch by a second control signal independent from the first control signal, and
    combining the first and second control signals within the electronic switch.

15. The method of claim 14,
    wherein the electronic switch is a dual gate switch transistor,
    wherein controlling the electronic switch by the first control signal comprises controlling the first gate of the dual gate switch transistor with a pulse width modulated signal to control a first part of a channel of the dual gate switch transistor, and
    wherein controlling the electronic switch by the second control signal comprises controlling the second gate of the dual gate switch transistor with an enable signal defining an operation window of the dual gate switch transistor to control a second part of the channel of the dual gate switch transistor, such that the combining is performed by the dual gate switch transistor.

16. The method of claim 15, wherein controlling the first gate comprises providing the pulse width modulated signal to a first gate driver circuit, and wherein controlling the second gate comprises providing the enable signal to a second gate driver circuit, the second gate driver circuit being independent from the first gate driver circuit.

17. The method of claim 16, further comprising providing the first gate driver circuit with power independent from providing the second gate driver circuit with power.

18. The method of claim 14, further comprising selectively coupling a load to a supply voltage by controlling the electronic switch.

19. The method of claim 18, wherein said selectively coupling comprises selectively coupling the load to one of ground or negative supply voltage, the method further comprising selectively coupling the load to a positive supply voltage using a further electronic switch.

* * * * *